US012569097B2

(12) United States Patent
Seo et al.

(10) Patent No.: US 12,569,097 B2
(45) Date of Patent: Mar. 10, 2026

(54) CLEANING MODULE, STORAGE SYSTEM, AND CLEANING METHOD FOR STORAGE APPARATUS

(71) Applicant: SEMES CO., LTD., Chungcheongnam-do (KR)

(72) Inventors: Sang Jin Seo, Gyeonggi-do (KR); Jung Ho Jo, Gyeonggi-do (KR); Myeong Ho Lee, Gyeonggi-do (KR); Sung Jae Lim, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 486 days.

(21) Appl. No.: 18/063,737

(22) Filed: Dec. 9, 2022

(65) Prior Publication Data

US 2023/0200602 A1 Jun. 29, 2023

(30) Foreign Application Priority Data

Dec. 27, 2021 (KR) ........................ 10-2021-0189004
Oct. 5, 2022 (KR) ........................ 10-2022-0127124

(51) Int. Cl.
| | |
|---|---|
| *A47L 9/14* | (2006.01) |
| *A47L 5/22* | (2006.01) |
| *A47L 7/00* | (2006.01) |
| *B08B 5/04* | (2006.01) |
| *H01L 21/677* | (2006.01) |

(52) U.S. Cl.
CPC ................. *A47L 9/149* (2013.01); *A47L 5/22* (2013.01); *A47L 9/1409* (2013.01); *B08B 5/04* (2013.01); *H01L 21/67769* (2013.01)

(58) Field of Classification Search
CPC ......... H01L 21/67769; H01L 21/67775; H01L 61/67733; H01L 21/6773; A47L 9/149; A47L 11/4025; A47L 2201/024; B08B 5/04

USPC .......................................................... 414/939
See application file for complete search history.

(56) References Cited

U.S. PATENT DOCUMENTS

| | | | | |
|---|---|---|---|---|
| 2,818,595 | A | * | 1/1958 | Rosewall .............. B41F 23/002 |
| | | | | 15/345 |
| 12,030,091 | B2 | * | 7/2024 | Wang ................ H01L 21/67046 |
| 2021/0161345 | A1 | | 6/2021 | Ryu |

FOREIGN PATENT DOCUMENTS

| | | | | | |
|---|---|---|---|---|---|
| CN | 203493571 | U | * | 3/2014 | ............... A47L 9/06 |
| JP | H05-201506 | A | | 8/1993 | |
| JP | 2002-261159 | A | | 9/2002 | |
| JP | 2013-071816 | A | | 4/2013 | |

(Continued)

OTHER PUBLICATIONS

Chinese Office Action issued by the China National Intellectual Property Administration on Mar. 29, 2025 in corresponding CN Patent Application No. 202211689716.8, with English translation.

(Continued)

*Primary Examiner* — Bryan R Muller
(74) *Attorney, Agent, or Firm* — Carter, DeLuca & Farrell LLP

(57) ABSTRACT

Disclosed is a cleaning module for cleaning a storage apparatus. The cleaning module includes a housing that defines an inner space, a suction mechanism that is installed in the inner space and that forms an air flow introduced into the inner space, and an exhaust part that discharges the air flow introduced into the inner space by the suction mechanism to the outside of the housing.

10 Claims, 12 Drawing Sheets

(56) References Cited

FOREIGN PATENT DOCUMENTS

| JP | 2016-66689 | A | 4/2016 |
|---|---|---|---|
| KR | 10-2006-0118802 | A | 11/2006 |
| KR | 20090036696 | A | 4/2009 |
| KR | 10-0898044 | B1 | 5/2009 |
| KR | 20190004533 | A | 1/2019 |
| KR | 10-2336495 | B1 | 12/2021 |
| WO | 2017/212841 | A1 | 12/2017 |

OTHER PUBLICATIONS

Korean Office Action issued by the Korean Intellectual Property Office on Feb. 28, 2024 in corresponding KR Patent Application No. 10-2022-0127124, with English translation.
Notice of Reasons for Refusal issued by the Japanese Patent Office on Mar. 5, 2024 in corresponding JP Patent Application No. 2022-206295, with English translation.

* cited by examiner

Figure 10:
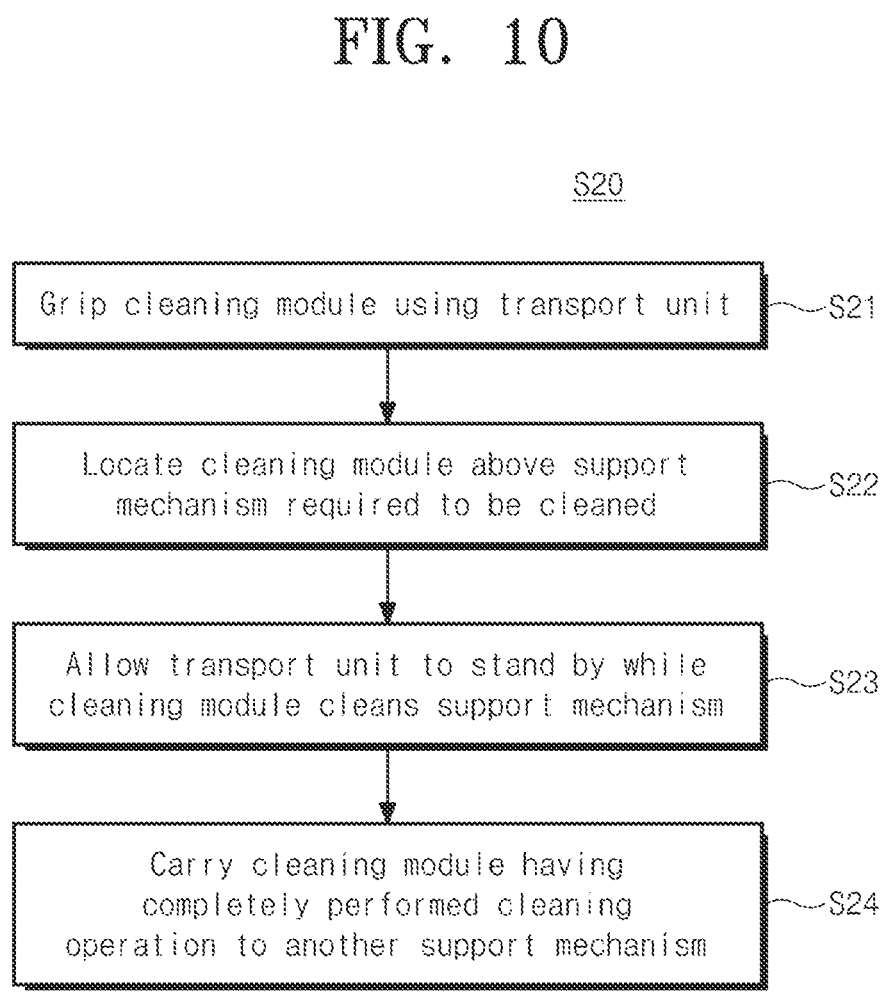

Grip cleaning module using transport unit — S21

Locate cleaning module above support mechanism required to be cleaned — S22

Allow transport unit to stand by while cleaning module cleans support mechanism — S23

Carry cleaning module having completely performed cleaning operation to another support mechanism — S24

CLEANING MODULE, STORAGE SYSTEM, AND CLEANING METHOD FOR STORAGE APPARATUS

CROSS-REFERENCE TO RELATED APPLICATIONS

This application claims priority under 35 U.S.C. § 119 to Korean Patent Application Nos. 10-2021-0189004 and 10-2022-0127124 filed on Dec. 27, 2021 and Oct. 5, 2022, respectively, in the Korean Intellectual Property Office, the disclosures of which are incorporated by reference herein in their entireties.

BACKGROUND

Embodiments of the present disclosure described herein relate to a cleaning module, a storage system, and a cleaning method for a storage apparatus.

In general, semiconductor elements are manufactured by repeatedly performing various unit processes, such as a photolithography process, an exposure process, an etching process, a diffusion process, a deposition process, a metal process, and the like, on a substrate such as a wafer. Each of the unit processes is performed in a substrate processing apparatus capable of performing the corresponding process. In the substrate processing apparatus, a transport apparatus (e.g., an overhead transport (OHT) or an auto mobile robot (AMR)) is used to carry a substrate to be processed (e.g., a wafer, glass, or the like) or a mask used to process the substrate. The substrate or the mask is carried in a state of being accommodated in a receiving container called a carrier, a cassette, a FOUP, a POD, or the like.

Receiving containers may be stored in a stocker that is a storage apparatus. The stocker includes shelves for storing the containers and a transport robot for carrying the containers between the shelves. The transport robot carries receiving containers between the shelves.

In general, in order to increase the number of receiving containers per unit area, the stocker is manufactured to be very high. The shelves included in the stocker are installed to a height of several meters to tens of meters from the bottom of a semiconductor manufacturing line.

Meanwhile, dust such as particles is generated for various reasons in the semiconductor manufacturing line. The dust is accumulated on the shelves included in the stocker. The dust accumulated on the shelves impedes sensing operations of sensors installed on the shelves (in general, the sensors detect whether the receiving containers are placed on the shelves). Furthermore, the dust accumulated on the shelves may be introduced into the receiving container for various reasons. Objects to be processed (e.g., wafers) that require a high level of cleanliness are accommodated in the receiving containers. If the dust is introduced into the receiving containers, the objects to be processed are contaminated. This may cause defects in products manufactured in the semiconductor manufacturing line.

For this reason, an operator performs a cleaning operation to remove the dust accumulated in the stocker. However, since the stocker is manufactured to be very high and some of the shelves included in the stocker are located at a height of several meters to tens of meters, it is not easy to remove the dust accumulated on the shelves. Furthermore, while the cleaning operation is performed, an operation of the stocker has to be stopped for safety reasons. In this case, the logistics flow in the semiconductor manufacturing line is affected by the stopping of the operation of the stocker. Therefore, the production efficiency of the semiconductor manufacturing line is lowered.

SUMMARY

Embodiments of the present disclosure provide a cleaning module for effectively cleaning a storage apparatus, a storage system, and a cleaning method of the storage apparatus.

Embodiments of the present disclosure provide a cleaning module for effectively collecting particles accumulated on a support shelf included in a storage apparatus, a storage system, and a cleaning method of the storage apparatus.

Embodiments of the present disclosure provide a cleaning module for cleaning a storage apparatus without stopping an operation of the storage apparatus in a process step in which the storage apparatus operates, a storage system, and a cleaning method of the storage apparatus.

Embodiments of the present disclosure provide a cleaning module for rapidly cleaning a storage apparatus in a maintenance step in which maintenance of the storage apparatus is performed, a storage system, and a cleaning method of the storage apparatus.

The technical problems to be solved by the present disclosure are not limited to the aforementioned problems, and any other technical problems not mentioned herein will be clearly understood from this specification and the accompanying drawings by those skilled in the art to which the present disclosure pertains.

According to an embodiment, a cleaning module for cleaning a storage apparatus includes a housing that defines an inner space, a suction mechanism that is installed in the inner space and that forms an air flow introduced into the inner space, and an exhaust part that discharges the air flow introduced into the inner space by the suction mechanism to the outside of the housing.

According to an embodiment, the cleaning module may further include a trap member that traps particles introduced into the inner space by the air flow formed by the suction mechanism.

According to an embodiment, the trap member may have an inverted funnel shape having an increasing width from top to bottom.

According to an embodiment, the trap member may include an inlet portion that faces the suction mechanism and an inclined portion that extends downward from the inlet portion and has a surface inclined with respect to a vertical direction.

According to an embodiment, the cleaning module may further include a suction part that faces a support mechanism of the storage apparatus and that is installed at the bottom of the housing, the suction part having a plate shape and having a plurality of holes formed therein.

According to an embodiment, the plurality of holes formed in the suction part may include a first hole and a second hole having a smaller diameter than the first hole.

According to an embodiment, when a region in which the first hole is formed in the suction part is referred to as a first region and a region in which the second hole is formed in the suction part is referred to as a second region, the number of second holes per unit area in the second region may be greater than the number of first holes per unit area in the first region.

According to an embodiment, the second hole may be formed in a position corresponding to a shelf sensor installed on the support mechanism of the storage apparatus.

According to an embodiment, the cleaning module may further include a discharge part installed in a position facing the particles trapped by the trap member and coupled to the housing by a hinge.

According to an embodiment, a storage system for storing an object includes at least one receiving container in which the object is accommodated, a storage apparatus that stores the receiving container, and at least one cleaning module that collects particles accumulated on support mechanisms of the storage apparatus. The storage apparatus includes a plurality of receiving parts including the support mechanisms, respectively, and a transport unit that carries the receiving container and the cleaning module between the receiving parts.

According to an embodiment, the receiving parts may be disposed in a first direction and a third direction perpendicular to the ground, and a hand of the transport unit may be configured to carry the receiving container and the cleaning module between the receiving parts.

According to an embodiment, each of the support mechanisms may include a shelf that supports the receiving container or the cleaning module and a shelf sensor installed on the shelf.

According to an embodiment, the cleaning module may include a housing that defines an inner space, a suction mechanism that is installed in the inner space and that forms an air flow introduced into the inner space, an exhaust part that discharges the air flow introduced into the inner space by the suction mechanism to the outside of the housing, and a suction part installed at the bottom of the housing, and The suction part may have a plate shape and may have a plurality of holes formed therein.

According to an embodiment, the plurality of holes may include a first hole and a second hole located closer to the shelf sensor than the first hole, when viewed from above.

According to an embodiment, the second hole may have a smaller diameter than the first hole.

According to an embodiment, when a region in which the first hole is formed in the suction part is referred to as a first region and a region in which the second hole is formed in the suction part is referred to as a second region, the number of second holes per unit area in the second region may be greater than the number of first holes per unit area in the first region.

According to an embodiment, the storage apparatus may further include at least one discharge part that discharges the particles collected in the cleaning module from the cleaning module, and the discharge part may include a discharge mechanism that discharges the particles collected in the cleaning module to the outside by opening a discharge part of the cleaning module, the discharge part being installed in a position facing the particles collected in the cleaning module.

According to an embodiment, the discharge mechanism may include a first pipe that is formed of a rigid material and that faces the discharge part and a second pipe formed of a flexible material and connected to the first pipe.

According to an embodiment, a method for cleaning a storage apparatus having an object accommodated therein using a cleaning module includes carrying the cleaning module to a first receiving part among a plurality of receiving parts included in the storage apparatus and collecting particles accumulated on a support mechanism of the first receiving part, and carrying the cleaning module to a second receiving part among the plurality of receiving parts and collecting particles accumulated on a support mechanism of the second receiving part, when a cleaning process is completely performed on one of the plurality of receiving parts.

According to an embodiment, in a process step in which the storage apparatus operates, a hand module that carries the cleaning module may perform another job while the cleaning module collects the particles accumulated on the support mechanism of the first receiving part, and in a maintenance step in which maintenance of the storage apparatus is performed, the hand module may stand by until the cleaning module completely collects the particles accumulated on the support mechanism of the first receiving part, and the hand module may carry the cleaning module to the second receiving part to collect the particles accumulated on the support mechanism of the second receiving part when the particles of the first receiving part are completely collected.

BRIEF DESCRIPTION OF THE FIGURES

The above and other objects and features of the present disclosure will become apparent by describing in detail embodiments thereof with reference to the accompanying drawings.

FIG. 10 is a flowchart illustrating a method of cleaning the storage apparatus in a maintenance step.

DETAILED DESCRIPTION

Figure 1:
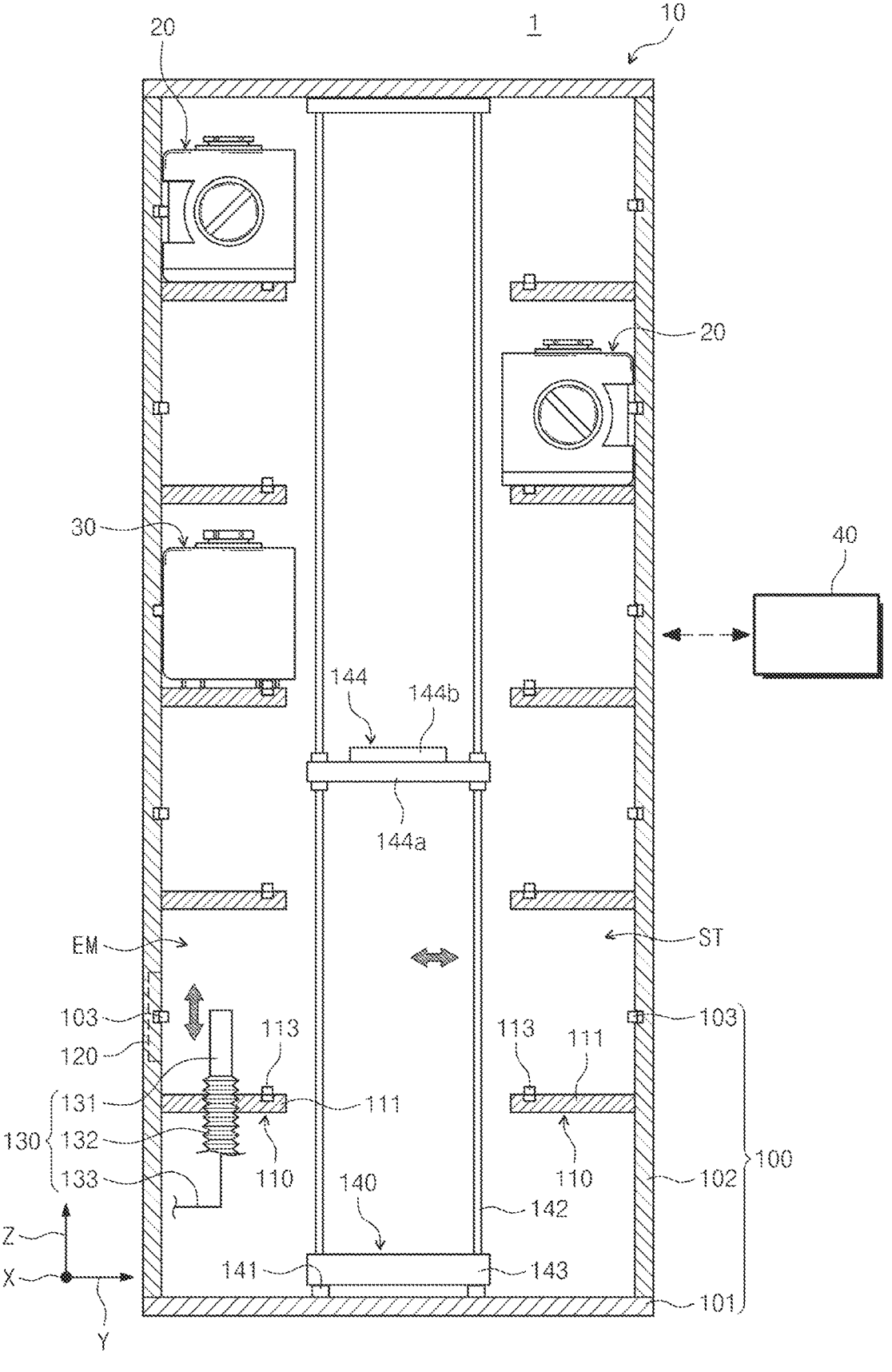
FIG. 1 is a sectional view of a storage system cut by a plane parallel to a second direction and a third direction.

Other advantages and features of the present disclosure, and implementation methods thereof will be clarified through the following embodiments to be described in detail with reference to the accompanying drawings. The present disclosure may, however, be embodied in different forms and should not be construed as being limited to the embodiments set forth herein. Rather, these embodiments are provided so that this disclosure is thorough and complete and fully conveys the scope of the present disclosure to a person skilled in the art to which the present disclosure pertains. Further, the present disclosure is only defined by the appended claims.

Even though not defined, all terms used herein (including technical or scientific terms) have the same meanings as those generally accepted by general technologies in the related art to which the present disclosure pertains. The terms defined in general dictionaries may be construed as having the same meanings as those used in the related art and/or a text of the present application and even when some terms are not clearly defined, they should not be construed as being conceptual or excessively formal.

The terms of a singular form may include plural forms unless otherwise specified. Furthermore, in the drawings, the shapes and dimensions of components may be exaggerated for clarity of illustration.

Hereinafter, embodiments of the present disclosure will be described with reference to FIGS. 1 to 12.

Figure 2:
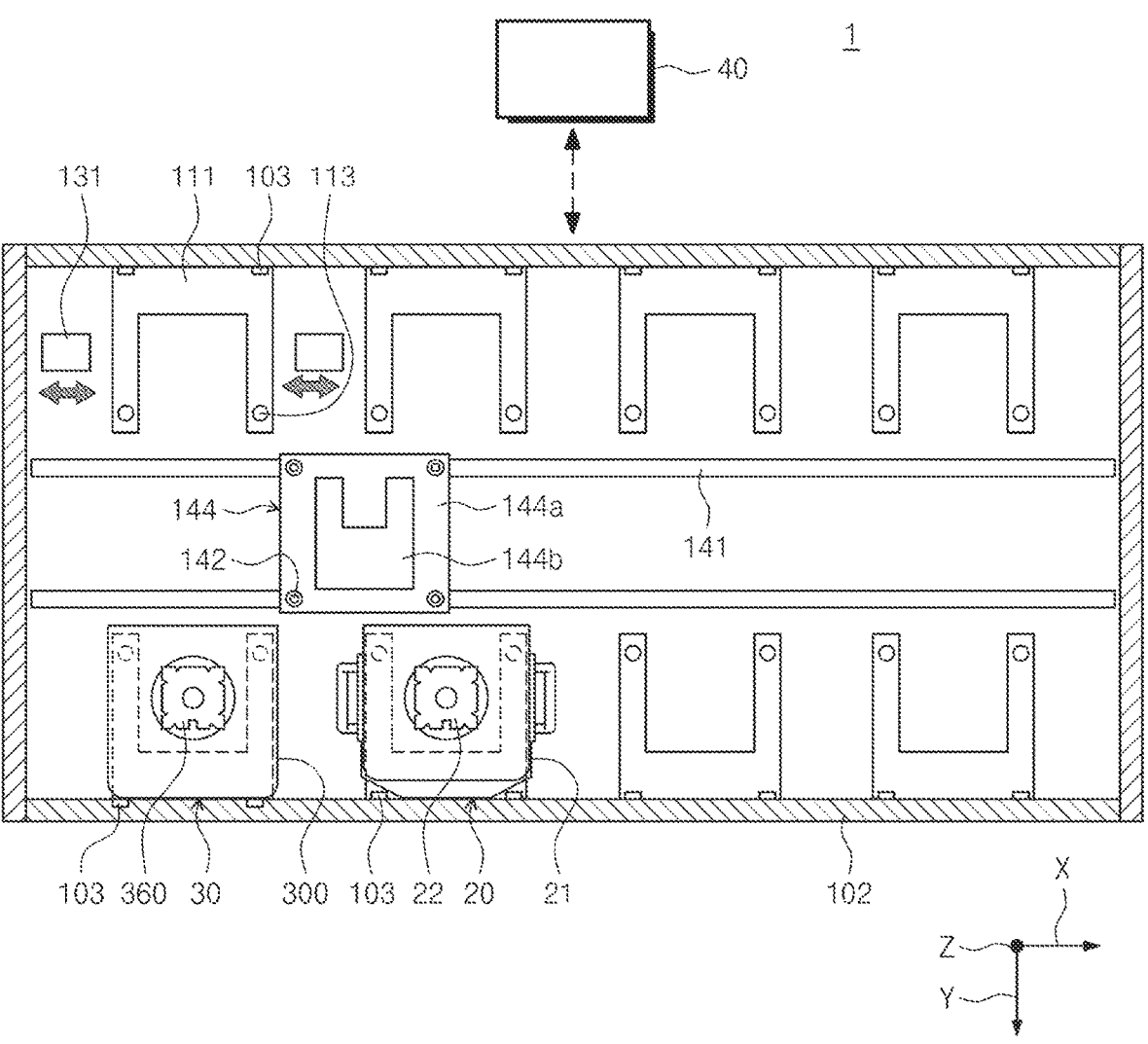
FIG. 2 is a sectional view of the storage system cut by a plane parallel to a first direction and the second direction.
Figure 3:
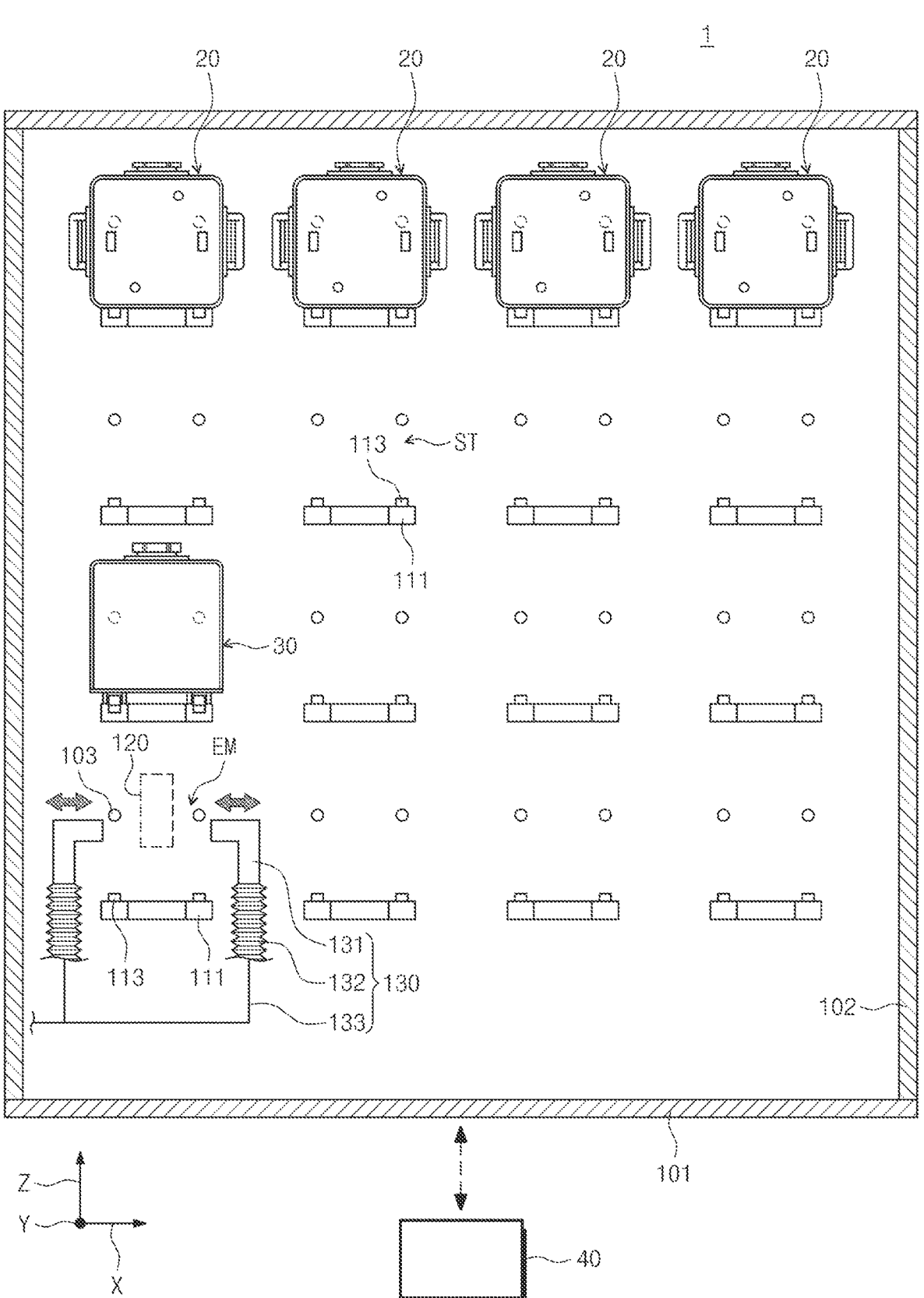
FIG. 3 is a sectional view of the storage system cut by a plane parallel to the first direction and the third direction.

FIG. 1 is a sectional view of a storage system cut by a plane parallel to a second direction and a third direction, FIG. 2 is a sectional view of the storage system cut by a plane parallel to a first direction and the second direction, and FIG. 3 is a sectional view of the storage system cut by a plane parallel to the first direction and the third direction.

Hereinafter, a travel direction of a transport unit 140 may be defined as the first direction X, a direction perpendicular to the first direction X when viewed from above may be defined as the second direction Y, and a direction perpendicular to the first direction X and the second direction Y may be defined as the third direction Z. The third direction Z may refer to a direction perpendicular to the ground.

Referring to FIGS. 1, 2, and 3, the storage system 1 according to an embodiment of the present disclosure may include a storage apparatus 10, a receiving container 20, a cleaning module 30, and a controller 40.

The storage apparatus 10 may store an object. The storage apparatus 10 may store the receiving container 20 in which the object is accommodated. The storage apparatus 10 may be referred to as a stocker. The storage apparatus 10 may include a frame 100, a support mechanism 110, a charging module 120, a discharge mechanism 130, and the transport unit 140.

The frame 100 may function as an overall skeleton of the storage apparatus 10. The frame 100 may be a body in which the support mechanism 110 to be described below is installed. The frame 100 may include a bottom frame 101 and a support frame 102. A running rail 141 of the transport unit 140 to be described below may be fixedly installed on the bottom frame 101. The support mechanism 110 to be described below may be fixedly installed in the support frame 102. Furthermore, a frame sensor 103 may be installed on the support frame 102. The frame sensor 103 may be installed for each receiving part ST to be described below. A plurality of frame sensors 103 may be installed for the respective receiving parts ST to be described below. The frame sensor 103 may be a push sensor. The frame sensor 103 may be a push sensor that transmits, to the controller 40 to be described below, a signal regarding whether the cleaning module 30 is seated in the receiving part ST to be described below, based on whether the push sensor is pressed by the cleaning module 30. Alternatively, the frame sensor 103 may be a distance sensor using a laser or the like. The frame sensor 103 may measure a distance from a rear surface of the receiving container 20 or a rear surface of the cleaning module 30 and may transmit a measurement value to the controller 40. The controller 40 may determine whether an object seated in the receiving part ST is the cleaning module 30 or the receiving container 20, based on the measurement value transmitted by the frame sensor 103.

The support mechanism 110 may be installed in the frame 100. The support mechanism 110 may be installed in the support frame 102 of the frame 100. The support mechanism 110 may be configured to support one of the receiving container 20 and the cleaning module 30.

The support mechanism 110 may include a shelf 111 and a shelf sensor 113. The shelf 111 may be installed on the support frame 102. A plurality of shelves 111 may be installed on the support frame 102. The shelves 111 may be installed in the first direction X and the third direction Z. The shelves 111 may be installed on one side with respect to the transport unit 140 and may be installed on an opposite side with respect to the transport unit 140. Although FIGS. 1 to 3 illustrate one example that twenty shelves 111 are installed in a 5×4 array on the one side and the opposite side with respect to the transport unit 140, the present disclosure is not limited thereto. The number of shelves 111 included in the storage apparatus 10 may be diversely modified.

The shelf 111 may have a fork shape. The shelf 111 may have a shape having a pair of fingers. The shelf sensor 113 may be installed on each of the pair of fingers of the shelf 111. The shelf sensor 113 may be a push sensor. The shelf sensor 113 may be a push sensor that transmits, to the controller 40 to be described below, a signal regarding whether the receiving container 20 is seated in the receiving part ST to be described below, based on whether the push sensor is pressed by the receiving container 20. Alternatively, the shelf sensor 113 may be a distance sensor using a laser or the like. The shelf sensor 113 may measure a distance from a lower surface of the receiving container 20 or a lower surface of the cleaning module 30 and may transmit a measurement value to the controller 40. The controller 40 may determine whether an object seated in the receiving part ST is the cleaning module 30 or the receiving container 20, based on the measurement value transmitted by the shelf sensor 113.

The support mechanism 110, a portion of the frame 100, and the frame sensor 103 installed on the frame 100 may be combined together to function as one unit capable of storing the receiving container 20. Hereinafter, the one unit is defined as the receiving part ST.

The charging module 120 may charge a battery included in the cleaning module 30 to be described below. The charging module 120 may charge the battery of the cleaning module 30 in a non-contact manner. The charging module 120 may be installed on the frame 100. The charging module 120 may be installed on the support frame 102. The charging module 120 may be installed on the support frame 102 so as to be adjacent to a selected one of support mechanisms 110.

The discharge mechanism 130 may discharge dust, such as particles, collected by the cleaning module 30 to be described below to the outside of the cleaning module 30. The discharge mechanism 130 may be disposed on a side of the support mechanism 110 adjacent to the charging module 120. The discharge mechanism 130 may include a first pipe 131, a second pipe 132, and a discharge line 133. The first pipe 131 may be formed of a rigid material such as metal. The second pipe 132 may be formed of a material (e.g., a flexible synthetic resin) that is stretchable in a lengthwise direction. The second pipe 132 may be connected with the discharge line 133 that is connected with a pressure-reducing apparatus, such as a pump, which provides reduced pressure. The first pipe 131 may be moved in the first direction X and the third direction Z by a drive mechanism (not illustrated). The drive mechanism may include a motor, an arm extended and retracted by the motor, and the like. The drive mechanism may be installed in the support frame 102.

The support mechanism 110, a portion of the frame 100, the frame sensor 103 installed on the frame 100, the charging module 120, and the discharge mechanism 130 may function as one unit that discharges particles collected in the cleaning module 30 to the outside of the cleaning module 30 and charges the battery included in the cleaning module 30. Hereinafter, the one unit is defined as an emptying/charging part EM. Although FIGS. 1 to 3 illustrate one example that one emptying/charging part EM is provided, the storage apparatus 10 may include a plurality of emptying/charging parts EM.

The transport unit 140 may carry the receiving container 20 within the storage apparatus 10. The transport unit 140 may carry the cleaning module 30 within the storage apparatus 10. The transport unit 140 may include the running rail 141, a lifting rail 142, a traveling actuator 143, and a hand module 144.

The running rail 141 may extend in the first direction X. The running rail 141 may be implemented with a pair of rails. The lifting rail 142 may extend in the third direction Z. The lifting rail 142 may be implemented with a plurality of rails.

The traveling actuator 143 may travel along the running rail 141. The traveling actuator 143 may be a traveling apparatus configured to travel along the running rail 141. Furthermore, the lifting rail 142 may be installed on the traveling actuator 143. Accordingly, when the traveling actuator 143 travels in the first direction X, the position of the lifting rail 142 may be changed in the first direction X.

The hand module 144 may move along the lifting rail 142. That is, the hand module 144 may be installed on the lifting rail 142 and may be configured such that the position of the hand module 144 is changed in the third direction Z. The hand module 144 may include a hand actuator 144a and a hand 144b installed on the hand actuator 144a. The hand actuator 144a may generate a driving force to move the hand module 144 upward and downward along the lifting rail 142. The hand actuator 144a may include at least one arm (not illustrated) that moves the hand 144b in the second direction Y. The hand actuator 144a may be configured to rotate the hand 144b about a rotational axis facing in the third direction Z. That is, the position of the hand 144b of the transport unit 140 may be changed in a selected direction among the first direction X, the second direction Y, and the third direction Z, and the hand 144b may rotate about the rotational axis facing in the third direction Z.

The receiving container 20 may accommodate an object. The receiving container 20 may accommodate a substrate, such as a wafer or glass, or a mask. The receiving container 20 may accommodate a plurality of substrates. The receiving container 20 may be a carrier, a cassette, a FOUP, or a POD. The receiving container 20 may be configured to be carried by the transport unit 140 to be described below. Furthermore, the receiving container 20 may be configured to be carried by an overhead transport (OHT) or an auto mobile robot (AMR) installed or provided in a semiconductor manufacturing line. A plurality of receiving containers 20 may be stored in the storage apparatus 10.

The receiving container 20 may include a container head 21 gripped by the hand 144b and a container 22 that defines a receiving space therein.

A rear surface of the container 22, when viewed from above, may have a rounded or inclined shape so as not to make contact with the frame sensor 103 installed on the support frame 102. An object to be processed that has a disk form, such as a wafer, may be accommodated in the container 22. In a case in which the container 22 has a shape similar to a rectangular parallelepiped, the ratio of an empty space to the inner space of the container 22 may be increased. That is, when the receiving container 20 is manufactured in a shape similar to a rectangular parallelepiped, the number of objects accommodated in the receiving container 20 may be the same, but the weight of the receiving container 20 may be increased to cause inefficiency, as compared with when the rear surface of the container 22 is formed to have a rounded or inclined shape. Accordingly, the rear surface of the container 22 of the receiving container 20 of the present disclosure, when viewed from above, may have a rounded or inclined shape so as not to make contact with the frame sensor 103 installed on the support frame 102.

The controller 40 may control the storage apparatus 10. The controller 40 may control the components of the storage system 1. The controller 40 may transmit, to the transport unit 140, a control signal to control the transport unit 140. In addition, based on detection signals transmitted by the frame sensor 103 and the shelf sensor 113, the controller 40 may determine a receiving part ST in which the receiving container 20 is seated and a receiving part ST on which the cleaning module 30 performs a cleaning process and may determine whether the emptying/charging part EM discharges particles collected by the cleaning module 30 to the outside and whether the emptying/charging part EM charges the battery of the cleaning module 30. The controller 40 may include a computer constituted by a memory, a CPU, and the like.

The storage system 1 may include at least one cleaning module 30. The cleaning module 30 may have a shape the same as, or similar to, the shape of the receiving container 20. Since the cleaning module 30 has a shape the same as, or similar to, the shape of the receiving container 20, the transport unit 140 may carry not only the receiving container 20 but also the cleaning module 30 in the same manner. That is, the transport unit 140 may carry the receiving container 20 between the receiving parts ST. Furthermore, the transport unit 140 may carry the cleaning module 30 between the receiving parts ST and between the receiving part ST and the emptying/charging part EM.

The cleaning module 30 may include a housing 300 that defines an inner space and a head 360 gripped by the hand 144b of the transport unit 140. The housing 300 may have a rectangular shape when viewed from above. The housing 300 may have a rectangular parallelepiped shape. Unlike the rear surface of the container 22, a rear surface of the housing 300 may have a flat shape so as to be brought into contact with the frame sensor 103. As will be described below, the cleaning module 30 is configured to suction particles such as dust accumulated on the support mechanism 110. That is, the cleaning module 30 of the present disclosure may be configured such that as many portions of the housing 300 as possible are in close contact and thus may effectively collect dust accumulated on the portion where the shelf 111 and the support frame 102 are connected.

Figure 4:
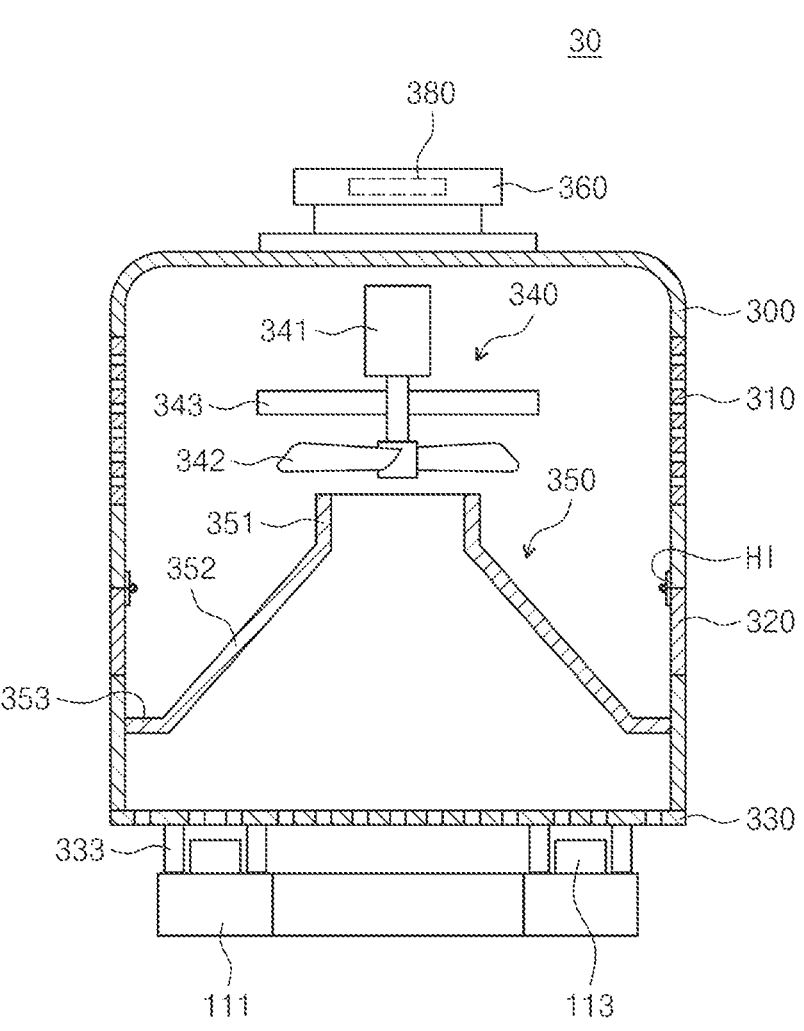
FIG. 4 is a view for describing a cleaning module.
Figure 5:
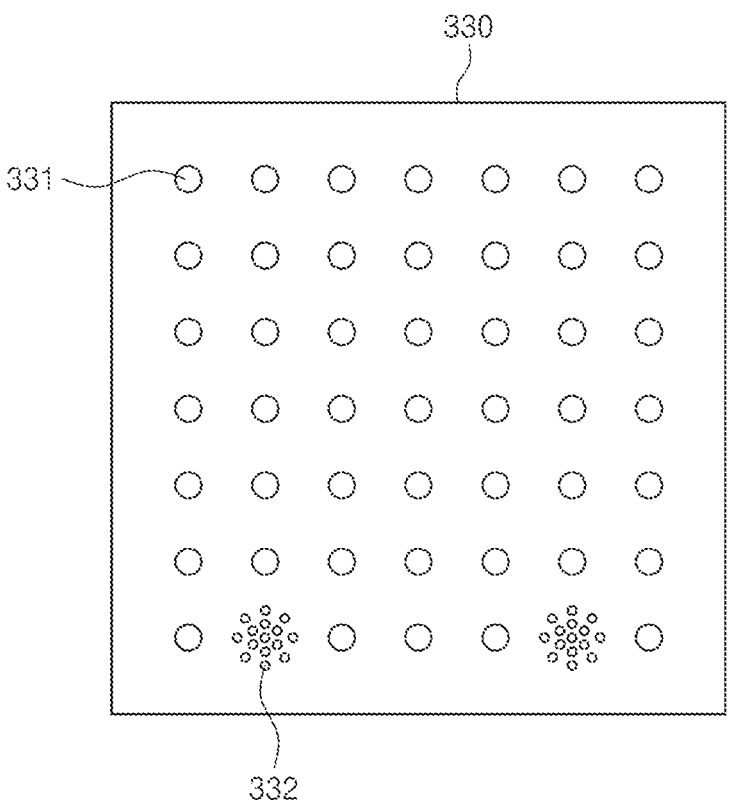
FIG. 5 is a view of a suction part of FIG. 4 as viewed from above.

FIG. 4 is a view for describing the cleaning module, and FIG. 5 is a view of a suction part of FIG. 4 as viewed from above.

Referring to FIGS. 4 and 5, the cleaning module 30 may include the housing 300, an exhaust part 310, a discharge part 320, the suction part 330, a suction mechanism 340, a trap member 350, the module head 360, a battery 370, and a communication device 380.

The housing 300 may define an inner space in which particles, such as duct, are collected. The housing 300 may have a container shape that is open at the bottom. The housing 300 may have a rectangular parallelepiped shape that is open at the bottom. The module head 360 may be installed at the top of the housing 300. The module head 360 may have a shape that is the same as, or similar to, the shape of the container head 21 described above. The module head 360 may be gripped by the hand 144b of the transport unit 140.

The exhaust part 310 may be installed on a side of the housing 300. The exhaust part 310 may have a plate shape having a plurality of holes formed therein. The exhaust part 310 may be a part that discharges an air flow introduced into the inner space by the suction mechanism 340, which will be described below, to the outside of the housing 300. A plurality of exhaust parts 310 may be provided. The exhaust parts 310 may be installed on one side and an opposite side of the housing 300.

The discharge part 320 may be installed on a side of the housing 300. The discharge part 320 may be a door that opens/closes an opening formed in a lateral portion of the housing 300. The discharge part 320 may be installed in a position facing particles D trapped by the trap member 350 to be described below. The discharge part 320 may have a plate shape. Furthermore, the discharge part 320 may be installed on a side of the housing 300 by a hinge H.

The suction part 330 may be installed at the bottom of the housing 300. The suction part 330 may be installed at the bottom of the housing 300 and may be combined with the housing 300 to form the inner space. The suction part 330 may have a plate shape. A plurality of holes 331 and 332 may be formed in the suction part 330. The holes formed in the suction part 330 may include the first holes 331 and the second holes 332. The second holes 332 may have a smaller diameter than the first holes 331. When a region in which the first holes 331 are formed is referred to as a first region and a region in which the second holes 332 are formed is referred to as a second region, the number of second holes 332 per unit area in the second region may be greater than the number of first holes 331 per unit area in the first region. The second holes 332 may be formed in a position corresponding to the shelf sensor 113 installed on the support mechanism 110. For example, when viewed from above, the second holes 332 may be closer to the shelf sensor 113 than the first holes 331.

The suction part 330 may include the first holes 331 and the second holes 332 so as to effectively collect dust, such as particles, near the shelf sensor 113. When the suction mechanism 340 forms an air flow, the air flow passing through the second holes 332 may relatively rapidly flow since the second holes 332 have a relative small area. Furthermore, the second holes 332 are relatively densely formed. Accordingly, a large number of rapidly flowing airflows are generated in the vicinity of the shelf sensor 113. Dust caught between the shelf sensor 113 and the shelf 111 may be difficult to easily remove. However, in the case in which the suction part 330 has the second holes 332, the dust caught between the shelf 111 and the shelf sensor 113 may be relatively easily removed.

Furthermore, support legs 333 may be installed at the bottom of the suction part 330. The support legs 333 may space a lower surface of the suction part 330 apart from an upper surface of the support shelf 111.

The suction mechanism 340 may be installed in the inner space defined by the housing 300. The suction mechanism 340 may form an air flow introduced into the inner space from below the housing 300. The suction mechanism 340 may include a motor 341, a fan 342, and a filter 343. The motor 341 may rotate the fan 342.

Figure 6:
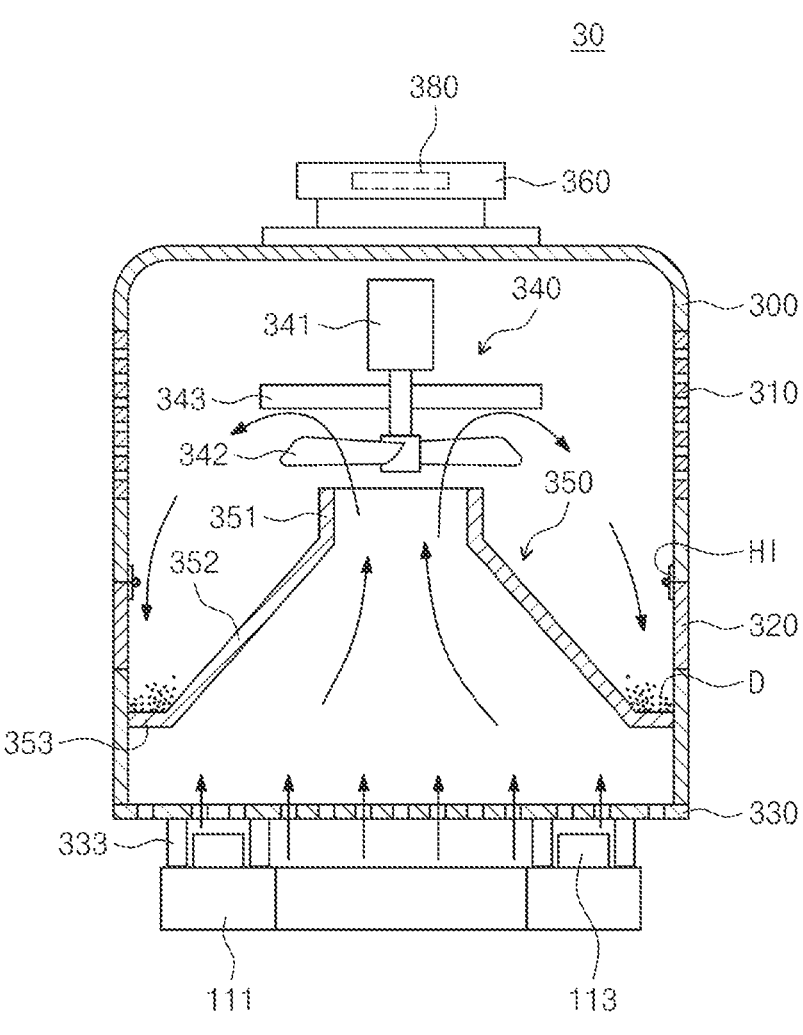
FIG. 6 is a view illustrating a state in which the cleaning module of FIG. 4 collects particles.

FIG. 6 is a view illustrating a state in which the cleaning module of FIG. 4 collects particles. FIG. 6 illustrates a state in which the cleaning module 30 placed in the receiving part ST cleans dust accumulated on the support mechanism 110 of the receiving part ST. Referring to FIG. 6, when the fan 342 rotates, an air flow introduced into the inner space of the housing 300 from below the cleaning module 30 may be formed. The formed air flow may collect dust such as particles D accumulated on the support shelf 111. The filter 343 may interrupt direct delivery of the particles D to the motor 341.

The trap member 350 may trap the particles D suctioned by the suction mechanism 340. The trap member 350 may have an inverted funnel shape having an increasing width from top to bottom. The trap member 350 may include an inlet portion 351, an inclined portion 352, and a trap portion 353. The inlet portion 351 may face the suction mechanism 340. The inclined portion 352 may extend downward from the inlet portion 351. The inclined portion 352 may have an inclined surface perpendicular to the third direction Z. Furthermore, the trap portion 353 may extend from the inclined portion 352 in a lateral direction. The particles D introduced into the inner space of the housing 300 through the inlet portion 351 may flow downward along the inclined surface of the inclined portion 352 and may be collected in the trap portion 353.

The communication device 380 may be a wireless communication device including a LAN card. The communication device 380 may transmit information about a state of the cleaning module 30 to the controller 40. For example, the cleaning module 30 may include a particle measurement device (not illustrated) that measures the amount of particles D in the inner space of the housing 300 as needed. The particle measurement device may be a particle meter. The communication device 380 may transmit, to the controller 40, the amount of particles D in the inner space that is measured by the particle measurement device. The communication device 380 is illustrated as being installed inside the module head 360. However, without being limited thereto, the communication device 380 may be attached to the housing 380.

Figure 7:
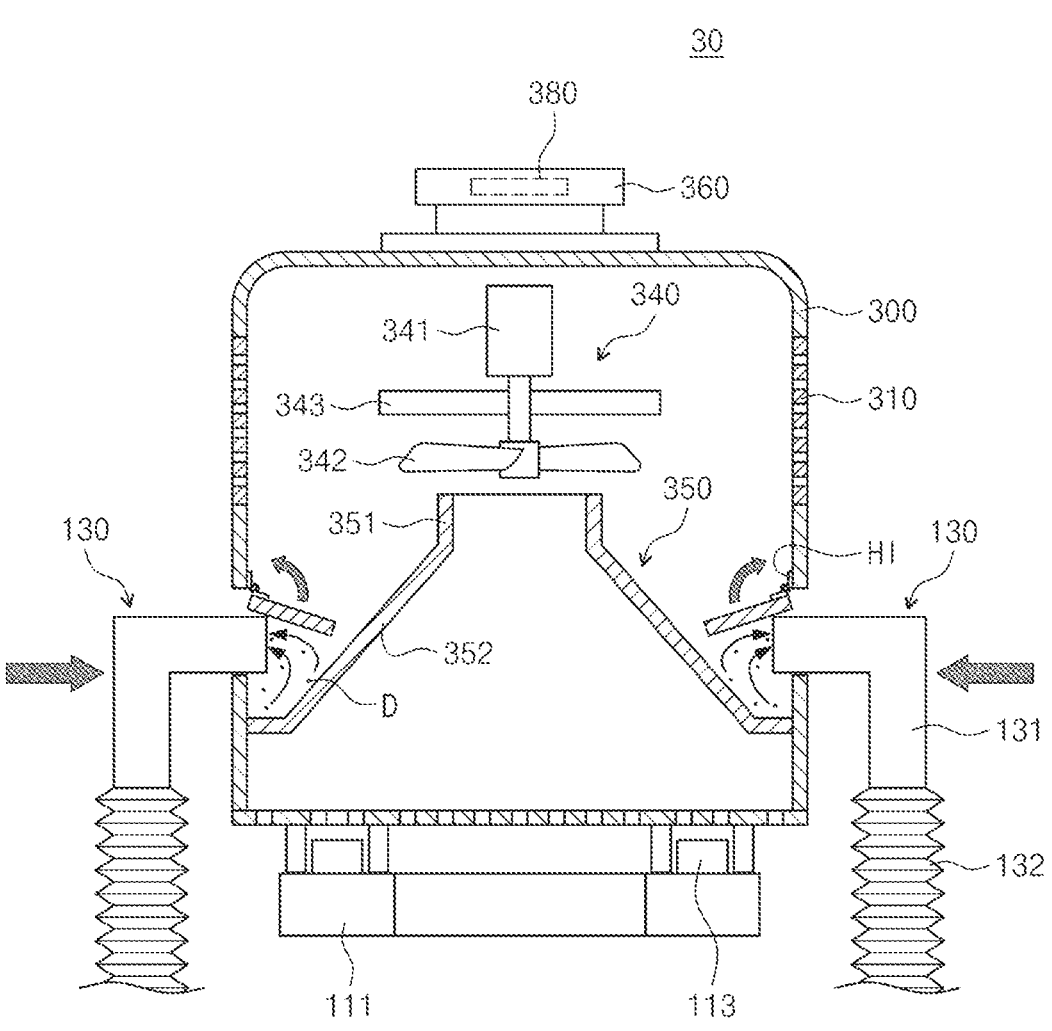
FIG. 7 is a view illustrating a state in which particles collected in the cleaning module of FIG. 4 are discharged outside the cleaning module.

FIG. 7 is a view illustrating a state in which particles collected in the cleaning module of FIG. 4 are discharged outside the cleaning module. FIG. 7 illustrates a state in which the cleaning module 30 is seated in the emptying/charging part EM and the particles D collected by the cleaning module 30 are discharged outside the cleaning module 30.

The first pipe 131 of the discharge mechanism 130 may face the discharge part 320. When the cleaning module 30 is placed in the emptying/charging part EM, the drive mechanism of the discharge mechanism 130 may move the first pipe 131 in a lateral direction. A contact sensor (not illustrated) may be installed at an inlet of the first pipe 131. When the contact sensor senses contact with the discharge part 320, the first pipe 131 may additionally move by a set distance and may open the discharge part 320. When the discharge part 320 is opened, the controller 40 may transmit a control signal to the discharge mechanism 130. The discharge mechanism 130 receiving the control signal may produce vacuum pressure and may suction the particles D trapped by the trap member 350. The particles D trapped by the trap member 350 may be discharged outside the cleaning module 30 through the discharge mechanism 130.

Figure 8:
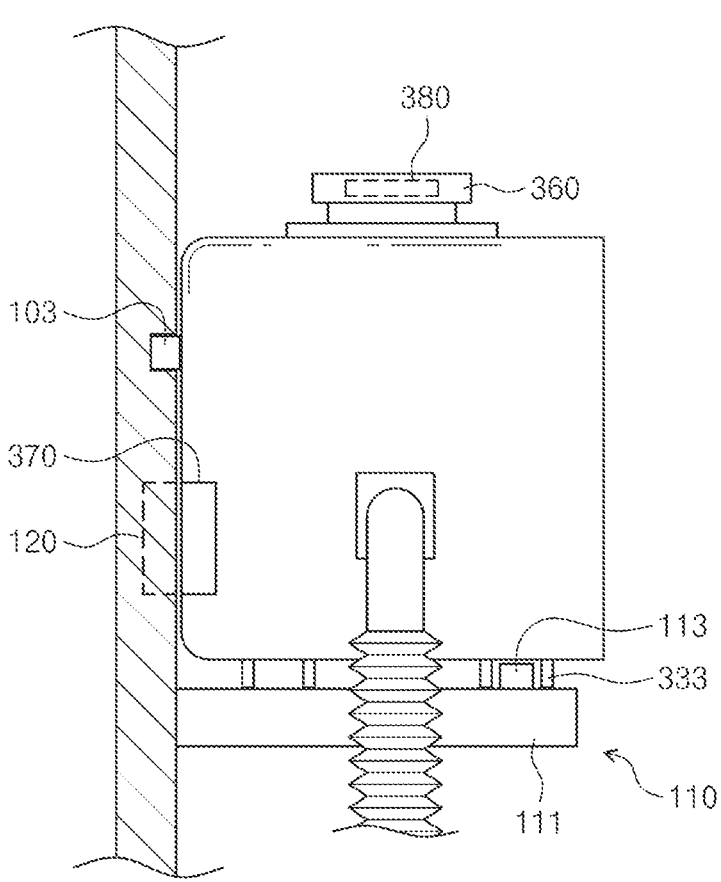
FIG. 8 is a view illustrating a state of charging a battery included in the cleaning module of FIG. 4.

FIG. 8 is a view illustrating a state of charging the battery included in the cleaning module of FIG. 4. Referring to FIG. 8, the cleaning module 30 may include the battery 370 for operating the components of the cleaning module 30 (e.g., the suction mechanism 340, the communication device 380, and the like). The battery 370 may deliver power to the suction mechanism 340, the communication device 380, or the like. When the cleaning module 30 is placed in the emptying/charging part EM, the charging module 120 installed on the support frame 102 may charge the battery 370 in a non-contact manner. The charging module 120 may charge the battery 370 by applying a well-known wireless charging method such as an electromagnetic induction method, a magnetic resonance method, an electric field coupling method, or a radio wave reception method.

Hereinafter, a method of cleaning the storage apparatus 10 using the cleaning module 30 of the present disclosure will be described.

Figure 9:
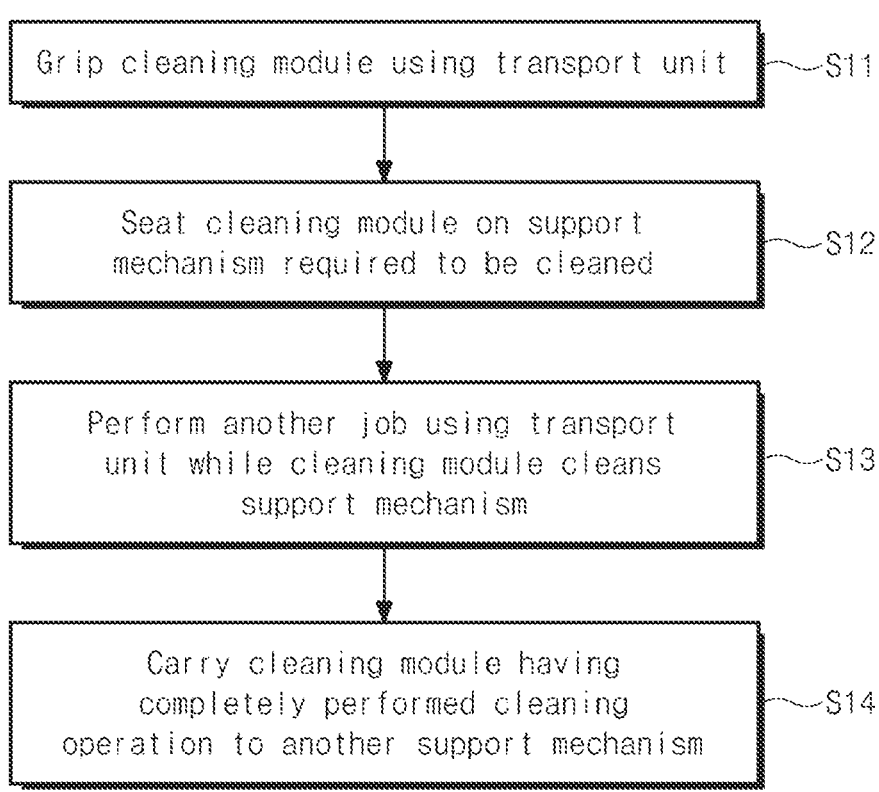
FIG. 9 is a flowchart illustrating a method of cleaning a storage apparatus in a process step.

FIG. 9 is a flowchart illustrating a method of cleaning the storage apparatus in a process step. Referring to FIGS. 1, 2, 3, and 9, the process step may be a step in which the storage apparatus 10 operates. In the process step, the transport unit 140 may receive a control signal from the controller 40 so as to perform a specified job. The job may mean a transport operation to be performed by the transport unit 140. In a case of using the cleaning module 30 according to an embodiment of the present disclosure, the support mechanism 110 of the storage apparatus 10 may be cleaned without stopping an operation of the storage apparatus 10.

Specifically, the method S10 of cleaning the storage apparatus 10 in the process step may include the following steps.

In step S11, the transport unit 140 may grip the cleaning module 30. The hand 144*b* of the transport unit 140 may grip the module head 360 of the cleaning module 30. Since the shape of the module head 360 is the same as or similar to the shape of the container head 21, the hand 144*b* may simultaneously grip the module head 360 and the container head 21. Accordingly, the separate hand module 144 for carrying the cleaning module 30 may not be required.

In step S12, the transport unit 140 may seat the cleaning module 30 on a support mechanism 110 required to be cleaned. The hand module 144 of the transport unit 140 may seat the cleaning module 30 on the support mechanism 110 required to be cleaned. The support mechanism 110 required to be cleaned may be previously selected by the controller 40. For example, the controller 40 may preferentially select a support mechanism 110 cleaned last by the cleaning module 30 or directly cleaned last by an operator through maintenance as a support mechanism 110 required to be cleaned.

In step S13, the transport unit 140 may perform another job while the cleaning module 30 cleans the support mechanism 110. The other job performed by the transport unit 140 may be an operation of carrying the receiving container 20 or an operation of carrying another cleaning module 30 of the storage system 1.

In step S14, the cleaning module 30 having completely performed the cleaning operation may be carried to another support mechanism 110.

As described above, according to the cleaning method according to the embodiment of the present disclosure, it is possible to clean the storage apparatus 10 without stopping an operation of the storage apparatus 10 even in the process step. In addition, since the transport unit 140 carries the cleaning module 30, the operator does not have to move to a high position to clean a support shelf 111 located at the high position.

FIG. 10 is a flowchart illustrating a method of cleaning the storage apparatus in a maintenance step. Referring to FIGS. 1, 2, 3, and 10, the maintenance step may be a step in which the storage apparatus 10 does not operate. In the maintenance step, maintenance of the storage apparatus 10 may be performed.

Specifically, the method S20 of cleaning the storage apparatus 10 in the maintenance step may include the following steps.

In step S21, the transport unit 140 may grip the cleaning module 30 as in step S11.

Figure 11:
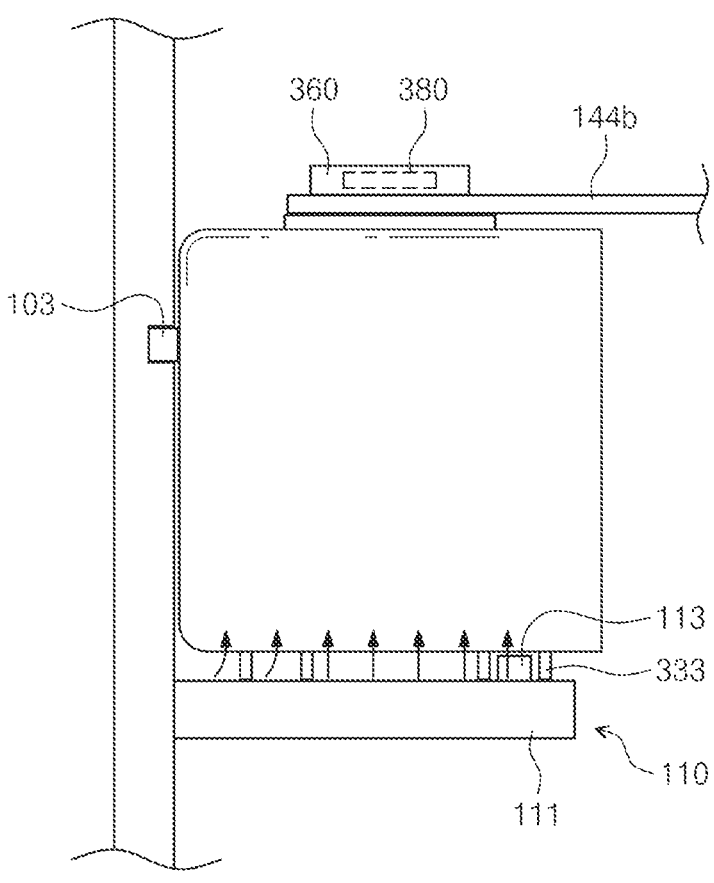
FIGS. 11 and 12 are views illustrating an example in which a transport unit stands by when the storage apparatus is cleaned in the maintenance step of FIG. 10.
Figure 12:
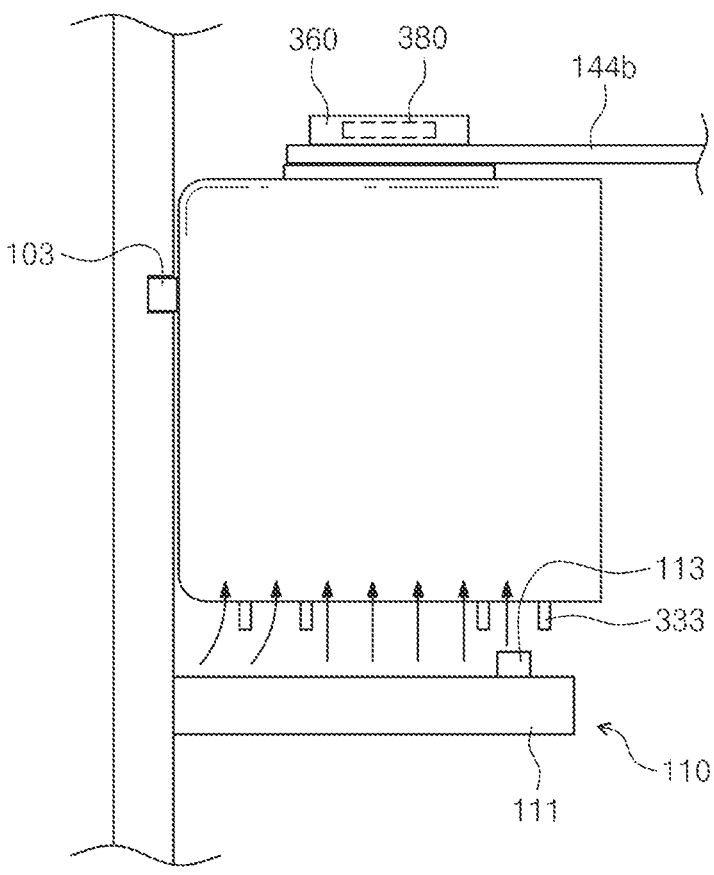

In step S22, the transport unit 140 may locate the cleaning module 30 above a support mechanism 110 required to be cleaned. Locating the cleaning module 30 above the support mechanism 110 may include not only seating the cleaning module 30 on the support mechanism 110 as illustrated in FIG. 11 but also gripping, by the hand 144*b*, the cleaning module 30 such that the cleaning module 30 is spaced apart from the support mechanism 110.

In step S23, the transport unit 140 may stand by while the cleaning module 30 cleans the support mechanism 110. The hand 144*b* of the transport unit 140 may stand by while the cleaning module 30 cleans the support mechanism 110.

In step S24, the cleaning module 30 having completely performed the cleaning operation may be carried to another support mechanism 110.

When the hand module 144 of the transport unit 140 stands by in the maintenance step as described above, the support mechanisms 110 may be more rapidly cleaned than when the hand module 144 does not stand by. Furthermore, in the maintenance step, the cleaning module 30 may be carried between receiving parts ST adjacent to each other. For example, when a first receiving part among the receiving parts ST is completely cleaned, the cleaning module 300 may be carried from the first receiving part to a second receiving part located next to the first receiving part or located just above/below the first receiving part and may clean the support mechanism 110. That is, in the maintenance step, to more rapidly clean the support mechanisms 110, the hand module 144 may stand by without performing another job while the cleaning module 30 cleans the support mechanism 110.

That is, according to an embodiment of the present disclosure, by differentiating operations of the transport unit 140 carrying the cleaning module 30 in the process step and the maintenance step, it is possible to help more efficiently clean the support mechanism 110 in each step. Furthermore, in the process step, the cleaning module 30 may be automatically carried by the controller 40. In addition, in the maintenance step, the cleaning module 30 may be automatically carried by the controller 40, or an operator may manually directly control the transport of the cleaning module 30 through the controller 40.

Although it has been described that the cleaning module 30 cleans dust accumulated on the support mechanism 110 included in the stocker, the present disclosure is not limited thereto. For example, the cleaning module 30 may remove dust accumulated on various components (e.g., an EFEM port, a side track buffer (STB), an EQ port, and the like) on which the receiving container 20 is able to be seated.

Although it has been described that the cleaning module 30 is carried by the above-described transport unit 140, the present disclosure is not limited thereto. For example, the cleaning module 30 may be carried by the OHT or the AMR described above.

As described above, according to the embodiments of the present disclosure, the storage apparatus may be effectively cleaned.

Furthermore, according to the embodiments of the present disclosure, particles accumulated on the support shelf included in the storage apparatus may be effectively collected.

Moreover, according to the embodiments of the present disclosure, the storage apparatus may be cleaned without stopping an operation of the storage apparatus in the process step in which the storage apparatus operates.

In addition, according to the embodiments of the present disclosure, the storage apparatus may be rapidly cleaned in the maintenance step in which the maintenance of the storage apparatus is performed.

Effects of the present disclosure are not limited to the aforementioned effects, and any other effects not mentioned herein may be clearly understood from this specification and the accompanying drawings by those skilled in the art to which the present disclosure pertains.

Although the embodiments of the present disclosure have been described above, it should be understood that the embodiments are provided to help with comprehension of the present disclosure and are not intended to limit the scope of the present disclosure and that various modifications and equivalent embodiments can be made without departing from the spirit and scope of the present disclosure. The drawings provided in the present disclosure are only drawings of the optimal embodiments of the present disclosure. The scope of the present disclosure should be determined by the technical idea of the claims, and it should be understood that the scope of the present disclosure is not limited to the literal description of the claims, but actually extends to the category of equivalents of technical value.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A storage system for storing an object, the storage system comprising:
   at least one receiving container in which the object is accommodated;
   a storage apparatus including a frame and configured to store the receiving container;
   at least one cleaning system comprising a suction mechanism and a particle trap configured to collect particles accumulated on support mechanisms installed on the frame of the storage apparatus, the support mechanisms defining a plurality of receiving areas for receiving one of the receiving container and the cleaning system;
   a transporter comprising a hand and configured to carry the receiving container and the cleaning system between the receiving areas; and
at least one discharge mechanism comprising at least one pipe located adjacent to at least one of said receiving areas and configured to discharge the particles collected in the particle trap, via a discharge part of the cleaning system, to the outside by opening the discharge part of the cleaning system.

2. The storage system of claim 1, wherein the receiving areas are spaced from each other in vertical and/or horizontal directions, and
   wherein the hand of the transporter is configured to carry the receiving container and the cleaning system between the receiving areas.

3. The storage system of claim 1, wherein each of the support mechanisms include:
   a shelf defining the respective receiving area and configured to support the receiving container or the cleaning module; and
   a shelf sensor installed on the shelf.

4. The storage system of claim 1, wherein the cleaning system further includes:
   a housing configured to define an inner space;
   the suction mechanism being installed in the inner space and configured to form an air flow introduced into the inner space;
   an exhaust part configured to discharge the air flow introduced into the inner space by the suction mechanism to the outside of the housing; and
   a suction part installed at the bottom of the housing, and
   wherein the suction part has a plate shape and has a plurality of holes formed therein.

5. The storage system of claim 4, wherein the plurality of holes include:
   a first hole; and
   a second hole located closer to the shelf sensor than the first hole, when viewed from above.

6. The storage system of claim 5, wherein the second hole has a smaller diameter than the first hole.

7. The storage system of claim 5, wherein when a region in which the first hole is formed in the suction part is referred to as a first region and a region in which the second hole is formed in the suction part is referred to as a second region, the number of second holes per unit area in the second region is greater than the number of first holes per unit area in the first region.

8. The storage system of claim 1, wherein the discharge part is installed in a position facing the internal space of the particle trap in the cleaning system.

9. The storage system of claim 1, wherein the discharge mechanism includes:
   a first pipe formed of a rigid material and configured to face the discharge part; and
   a second pipe formed of a flexible material and connected to the first pipe.

10. The storage system of claim 1, further comprising a controller configured to control the transporter based on signals from sensors disposed on the frame and support mechanisms.

* * * * *